United States Patent
Basker et al.

(10) Patent No.: US 9,570,591 B1
(45) Date of Patent: Feb. 14, 2017

(54) FORMING SEMICONDUCTOR DEVICE WITH CLOSE GROUND RULES

(71) Applicant: International Business Machines Corporation, Armonk, NY (US)

(72) Inventors: Veeraraghavan S. Basker, Schenectady, NY (US); Kangguo Cheng, Schenectady, NY (US); Theodorus Standaert, Clifton Park, NY (US); Junli Wang, Singerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/966,171

(22) Filed: Dec. 11, 2015

Related U.S. Application Data

(63) Continuation of application No. 14/864,122, filed on Sep. 24, 2015.

(51) Int. Cl.
| | |
|---|---|
| *H01L 29/66* | (2006.01) |
| *H01L 21/306* | (2006.01) |
| *H01L 21/28* | (2006.01) |
| *H01L 21/283* | (2006.01) |

(52) U.S. Cl.
CPC ........ *H01L 29/66795* (2013.01); *H01L 21/283* (2013.01); *H01L 21/28008* (2013.01); *H01L 21/30604* (2013.01); *H01L 29/66553* (2013.01)

(58) Field of Classification Search
CPC .................... H01L 29/66795; H01L 29/66553; H01L 21/28008; H01L 21/30604; H01L 21/283
See application file for complete search history.

(56) References Cited

U.S. PATENT DOCUMENTS

| | | | | |
|---|---|---|---|---|
| 7,465,973 | B2 * | 12/2008 | Chang .................... | H01L 27/11 257/206 |
| 7,906,814 | B2 * | 3/2011 | Lee ...................... | H01L 29/4908 257/353 |
| 8,252,021 | B2 * | 8/2012 | Boulnois ............... | A61B 17/282 606/205 |
| 8,338,310 | B2 * | 12/2012 | Jung .................... | H01L 21/3086 216/46 |
| 8,680,626 | B2 * | 3/2014 | Smayling .......... | H01L 21/28518 257/211 |

(Continued)

OTHER PUBLICATIONS

List of IBM Patents or Patent Applications Treated as Related; YOR920150618US2, Date Filed; Dec. 11, 2015, p. 1-2.

(Continued)

*Primary Examiner* — William Coleman
(74) *Attorney, Agent, or Firm* — Cantor Colburn LLP; Vazken Alexanian

(57) ABSTRACT

A method for fabricating a semiconductor device comprises forming active regions on a semiconductor substrate, forming a gate stack over the active regions and regions adjacent to the active regions, depositing a layer of conductive material over the active regions and the substrate, patterning a first mask over the conductive material, etching to remove exposed portions of the conductive material and form conductive contacts, patterning a second mask over portions of the gate stacks and conductive contacts, and etching to remove exposed portions of the gate stack.

19 Claims, 31 Drawing Sheets

(56) References Cited

U.S. PATENT DOCUMENTS

| | | | |
|---|---|---|---|
| 8,741,776 B2* | 6/2014 | De | H01L 21/823431 438/699 |
| 8,863,063 B2* | 10/2014 | Becker | H01L 27/092 716/118 |
| 8,881,066 B2* | 11/2014 | Shieh | H01L 21/823431 716/51 |
| 9,236,267 B2* | 1/2016 | De | H01L 21/845 |
| 2007/0172770 A1* | 7/2007 | Witters | H01L 21/0337 430/313 |
| 2014/0091403 A1* | 4/2014 | Masuoka | H01L 29/4238 257/413 |
| 2016/0049395 A1* | 2/2016 | Okagaki | G06F 17/5077 257/401 |
| 2016/0172380 A1* | 6/2016 | Kanakasabapathy | H01L 29/16 257/347 |

OTHER PUBLICATIONS

Veeraraghavan S. Basker, et al., "Forming Semiconductor Device With Close Ground Rules", U.S. Appl. No. 14/864,122, filed Sep. 24, 2015.

* cited by examiner

FORMING SEMICONDUCTOR DEVICE WITH CLOSE GROUND RULES

DOMESTIC PRIORITY

This application is a continuation of U.S. Non-Provisional application Ser. No. 14/864,122, entitled "FORMING SEMICONDUCTOR DEVICE WITH CLOSE GROUND RULES", filed Sep. 24, 2015, which is incorporated herein by reference in its entirety.

BACKGROUND

The present invention relates to semiconductor devices, and more specifically, to fabricating semiconductor devices having close ground rules.

Semiconductor devices such as, field effect transistor devices are often arranged on a semiconductor substrate. Methods for fabricating such devices include forming gate stacks on the substrate and active source and drain regions adjacent to the gates stacks. The gate stacks are often arranged in parallel crossing a number of active regions. During fabrication, the gate stacks may be cut or trimmed to form a desired arrangement on the substrate.

Often an insulator or dielectric layer is deposited over the active regions of the devices. Cavities are formed in the insulator layer to expose the active regions, the cavities are filled with a conductive material and planarized to form conductive contacts.

SUMMARY

According to one embodiment of the present invention, a method for fabricating a semiconductor device comprises forming active regions on a semiconductor substrate, forming a gate stack over the active regions and regions adjacent to the active regions, depositing a layer of conductive material over the active regions and the substrate, patterning a first mask over the conductive material, etching to remove exposed portions of the conductive material and form conductive contacts, patterning a second mask over portions of the gate stacks and conductive contacts, and etching to remove exposed portions of the gate stack.

According to another embodiment of the present invention, a method for forming a semiconductor device comprises etching a semiconductor substrate to pattern a fin on the substrate, forming a gate stack over the fin, forming a spacer adjacent to the gate stack, forming an active region on the fin, depositing a layer of conductive material on the substrate, the fin, and the active region, patterning a first mask over the conductive material, etching to remove exposed portions of the conductive material and form conductive contacts, patterning a second mask over portions of the gate stacks and conductive contacts, and etching to remove exposed portions of the gate stack.

According to yet another embodiment of the present invention, a semiconductor device comprises a first gate stack arranged on a semiconductor substrate the first gate stack having a first distal end and a second distal end, a second gate stack arranged on the substrate, the second gate stack having a first distal end and a second distal end, a conductive contact arranged over active regions arranged adjacent to the first gate stack and the second gate stack, and an insulator material arranged on the substrate between the first distal end of the first gate stack and the second distal end of the second substrate, at the second distal end of the first gate stack, and at the second distal end of the second gate stack.

DETAILED DESCRIPTION

Figure 1A:
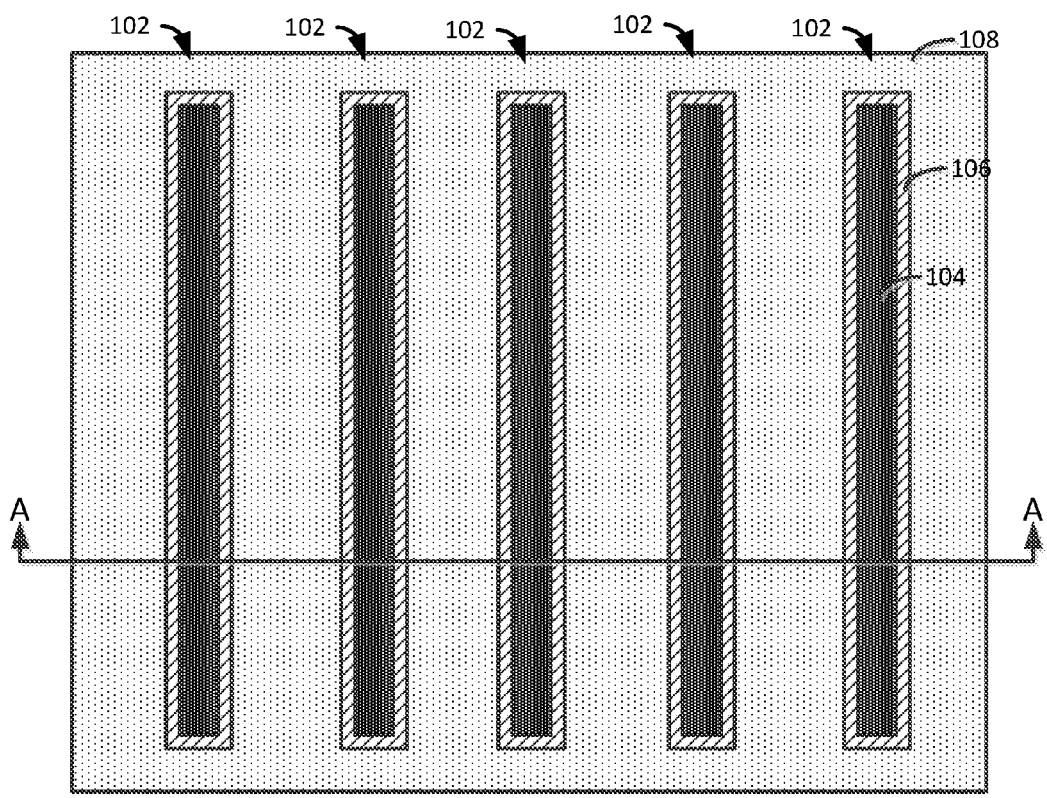
FIG. 1A illustrates a top view of an arrangement of gate stacks on a substrate.

Previous methods for cutting gate stacks and forming contacts for field effect transistor (FET) devices used photolithographic patterning and etching processes to align etches that form the desired features. Such methods become more difficult as the scale of the FET devices is decreased and may result in undesirable shorts between gate stacks or poorly aligned contacts. The methods and resultant structures described herein provide for forming conductive contacts, and trimming gate stacks to a desired arrangement while reducing potential alignment difficulties that arise when aligning photolithographic masks with high tolerances.

In device fabrication, the active regions of the FET devices are often formed by performing an epitaxial growth process that increases the size of the active regions. The epitaxial growth process for active regions that are close to distal ends of the gates, can sometimes result in undesirable electrical shorts between the grown active regions and distal ends of the gate stacks. Overcoming challenge, along with challenges in aligning masks under tight tolerances may be accomplished by the exemplary methods and structures described herein. The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

Figure 1B:
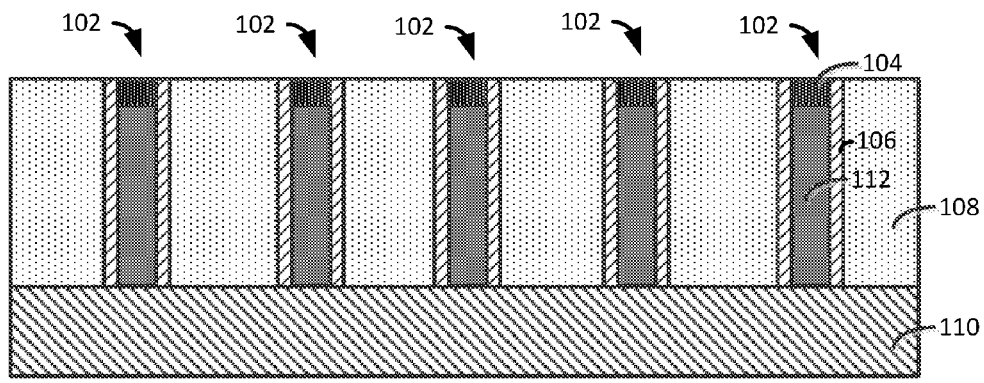
FIG. 1B illustrates a cross-sectional view along the line A-A of FIG. 1A.

FIG. 1A illustrates a top view of an arrangement of gate stacks 102 on a substrate. FIG. 1B illustrates a cross-sectional view along the line A-A of FIG. 1A of gate stacks 102 on the substrate 110. The substrate 110 may include active regions (semiconductor region that will be used to form devices, and isolation regions that isolates devices from adjacent devices. Non-limiting examples of suitable substrate materials include Si (silicon), strained Si, SiC (silicon carbide), Ge (geranium), SiGe (silicon germanium), SiGeC (silicon-germanium-carbon), Si alloys, Ge alloys, GaAs (gallium arsenide), InAs (indium arsenide), InP (indium phosphide), or any combination thereof.

Other examples of suitable substrates include silicon-on-insulator (SOI) substrates with buried oxide (BOX) layers. An SOI wafer includes a thin layer of a semiconducting material atop an insulating layer (i.e., an oxide layer) which is in turn disposed on a silicon substrate. The semiconducting material can include, but is not limited to, Si (silicon), strained Si, SiC (silicon carbide), Ge (geranium), SiGe (silicon germanium), SiGeC (silicon-germanium-carbon), Si alloys, Ge alloys, GaAs (gallium arsenide), InAs (indium arsenide), InP (indium phosphide), or any combination thereof.

The gate stacks 102 have a metal gate portion 112 that is capped with a capping layer 104. Spacers 106 are arranged along sidewalls of the gate stacks 102. An insulator layer 108 is arranged on the substrate 110 adjacent to the gate stacks 102.

The gate stacks 102 includes high-k metal gates formed, for example, by filling a dummy gate opening (not shown) with one or more high-k dielectric materials, one or more workfunction metals, and one or more metal gate conductor materials. The high-k dielectric material(s) can be a dielectric material having a dielectric constant greater than 4.0, 7.0, or 10.0. Non-limiting examples of suitable materials for the high-k dielectric material include oxides, nitrides, oxynitrides, silicates (e.g., metal silicates), aluminates, titanates, nitrides, or any combination thereof. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The high-k dielectric material layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the high-k dielectric material may vary depending on the deposition process as well as the composition and number of high-k dielectric materials used. The high-k dielectric material layer may have a thickness in a range from about 0.5 to about 20 nm.

The work function metal(s) may be disposed over the high-k dielectric material. The type of work function metal(s) depends on the type of transistor and may differ between, for example, an NFET and a PFET device. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof.

A conductive metal 112 is deposited over the high-k dielectric material(s) and workfunction layer(s) to form the gate stacks 102. Non-limiting examples of suitable conductive metals include aluminum (Al), platinum (Pt), gold (Au), tungsten (W), titanium (Ti), or any combination thereof. The conductive metal may be deposited by a suitable deposition process, for example, CVD, PECVD, PVD, plating, thermal or e-beam evaporation, and sputtering.

A planarization process, for example, chemical mechanical planarization (CMP), is performed to polish the surface of the conductive gate metal 112.

The spacers 106 may be formed by a dielectric such as a low-k spacer material that may include Si, N, and at least one element selected from the group consisting of C and B. Additionally, the low-k spacer material may contain Si, N, B, and C. For example, the low-k spacer material may include SiBN, SiCN, SiBCN, SiOCN, or any combination thereof.

The insulator layer 108 may be formed from, for example, a low-k dielectric oxide, including but not limited to, silicon dioxide, spin-on-glass, a flowable oxide, a high density plasma oxide, borophosphosilicate glass (BPSG), or any combination thereof. The insulator layer 108 is deposited by a suitable deposition process, including, but not limited to CVD, PVD, plasma enhanced CVD, atomic layer deposition (ALD), evaporation, chemical solution deposition, or like processes. The insulator layer 108 may further comprise a liner (e.g., silicon nitride) (not shown) that is deposited before the oxide.

Figure 2A:
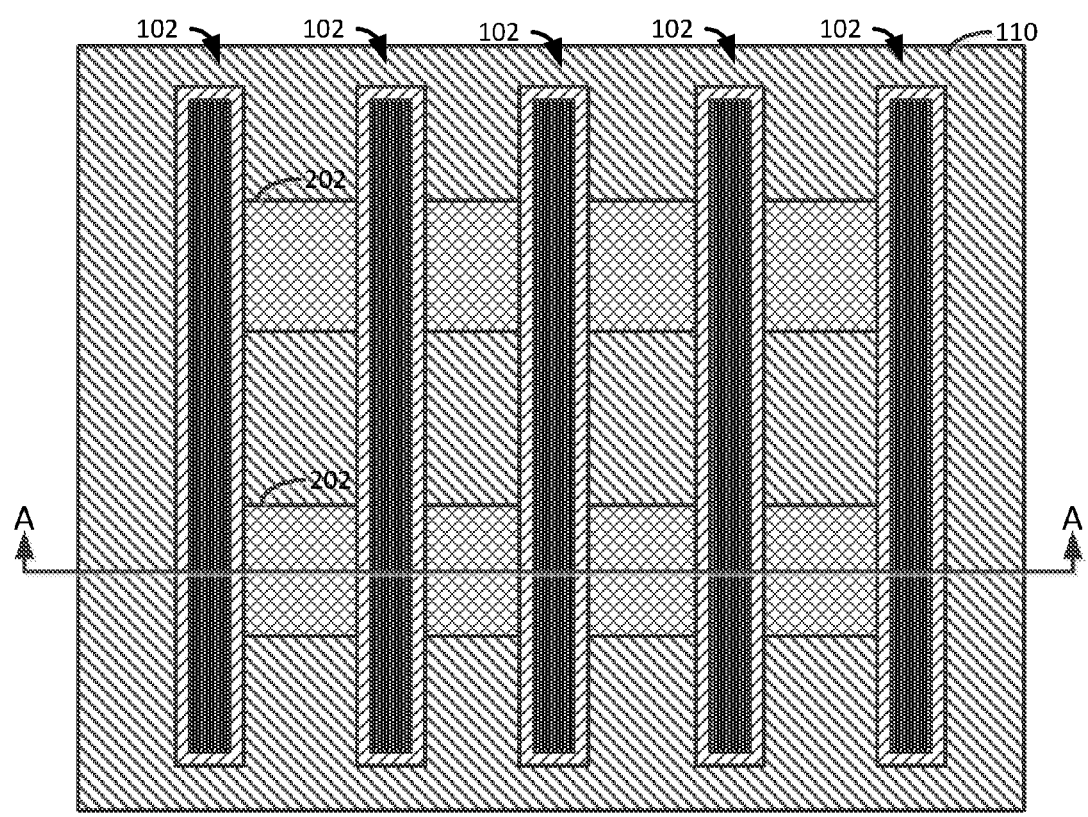
FIG. 2A illustrates a top view of the resultant structure following an etching process.
Figure 2B:
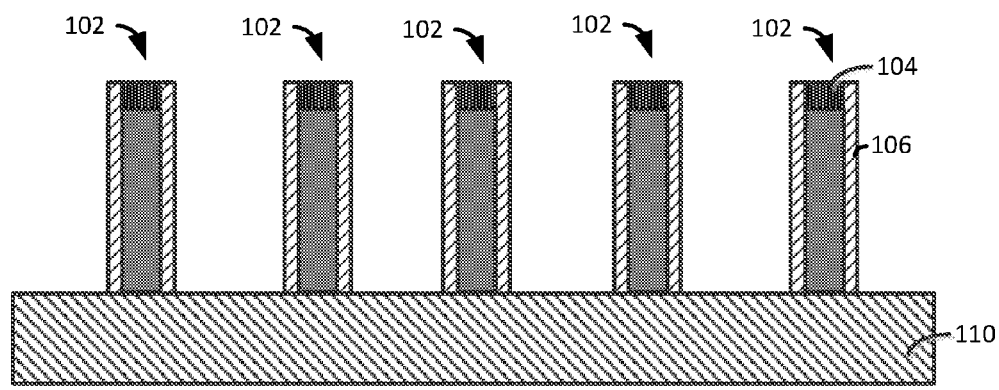
FIG. 2B illustrates a cut away view along the line A-A of FIG. 2A.

FIG. 2A illustrates a top view and FIG. 2B illustrates a cut away view along the line A-A of FIG. 2A of the resultant structure following an etching process that removes exposed portions of the insulator layer 108 and exposes portions of the substrate 110. In the illustrated embodiment, the gate stacks 102 are arranged over active regions 202 of the substrate 110. In the illustrated embodiment, the active regions 202 have similar dopants. However, in alternate embodiments, the active regions 202 may include different types of dopants to form, for example, n-type and p-type devices on the substrate 110. Once the insulator layer 108 has been removed, the active regions 202 may be exposed in some embodiments, or may be formed by, for example, an epitaxial growth process, an ion implantation process or a combination of an epitaxial growth process and ion implantation process. Alternatively, the source/drain region 202 can be formed at earlier stage (e.g., after forming gate (either dummy gate or real gate) and spacer, but prior to deposition of the insulator layer 108.

Following the formation of the active regions, optionally, a silicide may be formed on the active regions. The silicide, may be formed in previous processes, for example, prior to the deposition of the insulator layer 108 (of FIG. 1A) or may be formed following the removal of the insulator layer 108. In some embodiment, the silicide is formed after the deposition of the contact metal 302.

In this regard, a metal silicide film is formed by performing a thermal treatment to a metallic film. The metallic film can be deposited by performing an evaporation process or a sputtering process. The metallic film is annealed by heating inside a furnace or performing a rapid thermal treatment in an atmosphere containing pure inert gases (e.g., nitrogen or argon) so that the metal reacts with exposed silicon in the substrate 110 to form a metal silicide layer. Non-limiting examples of suitable metal silicide materials include titanium silicide, tungsten silicide, cobalt silicide, nickel silicide, molybdenum silicide, platinum silicide, or any combination thereof.

Figure 3A:
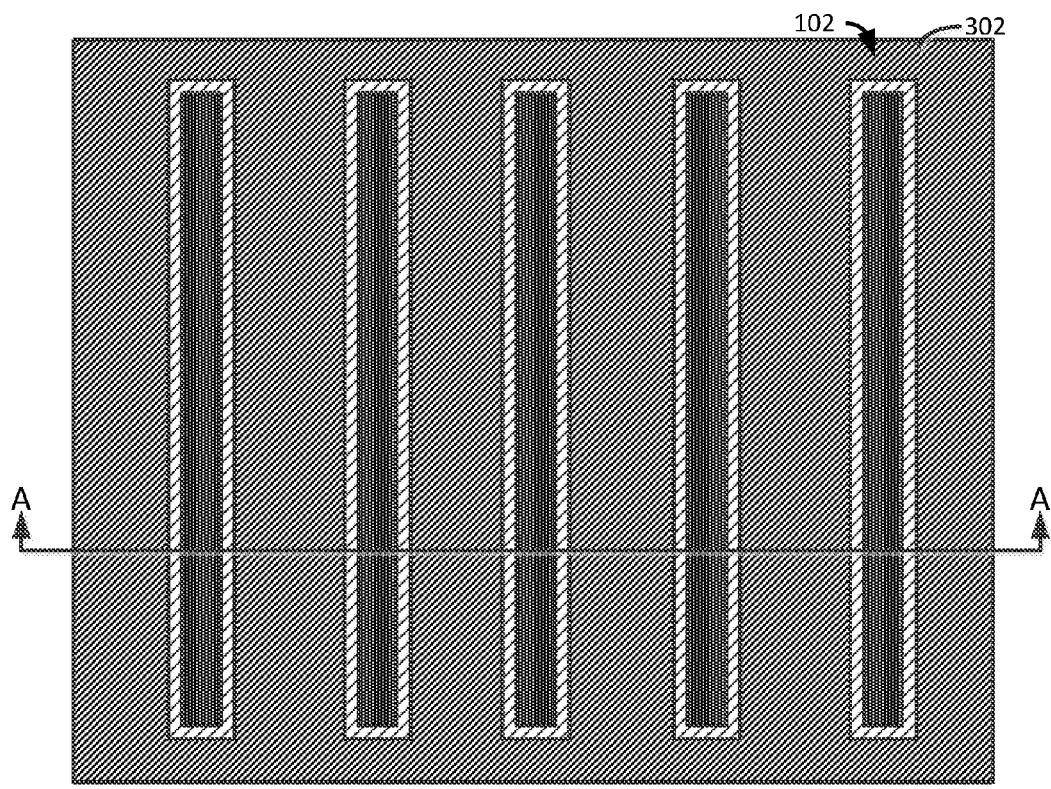
FIG. 3A illustrates a top view following the deposition of a layer of conductive material.
Figure 3B:
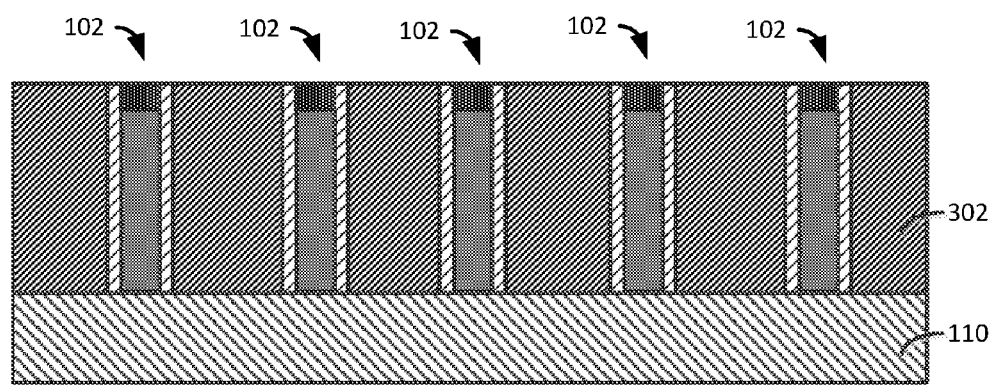
FIG. 3B illustrates a cut away view along the line A-A of FIG. 3A.

FIG. 3A illustrates a top view and FIG. 3B illustrates a cut away view along the line A-A of FIG. 3A following the deposition of a layer of conductive material 302. Once the insulator layer 108 has been removed, and the active regions 202 have been formed with the desired dopants, epitaxial growth, and silicide formation, a layer of conductive material 302 is deposited over the exposed portions of the substrate 110 and the gate stacks 102. The layer of conductive material 302 may be deposited by, for example, a spin on deposition process. Following the deposition of the layer of conductive material 302, a planarization process such as, for example, chemical mechanical polishing (CMP) is performed to remove overburden portions of the conductive material 302 and expose the gate stacks 102. The conductive material 302 may include a liner (e.g., Ti, TiN, NiPt, etc.) followed by another conductor such as tungsten.

Figure 4A:
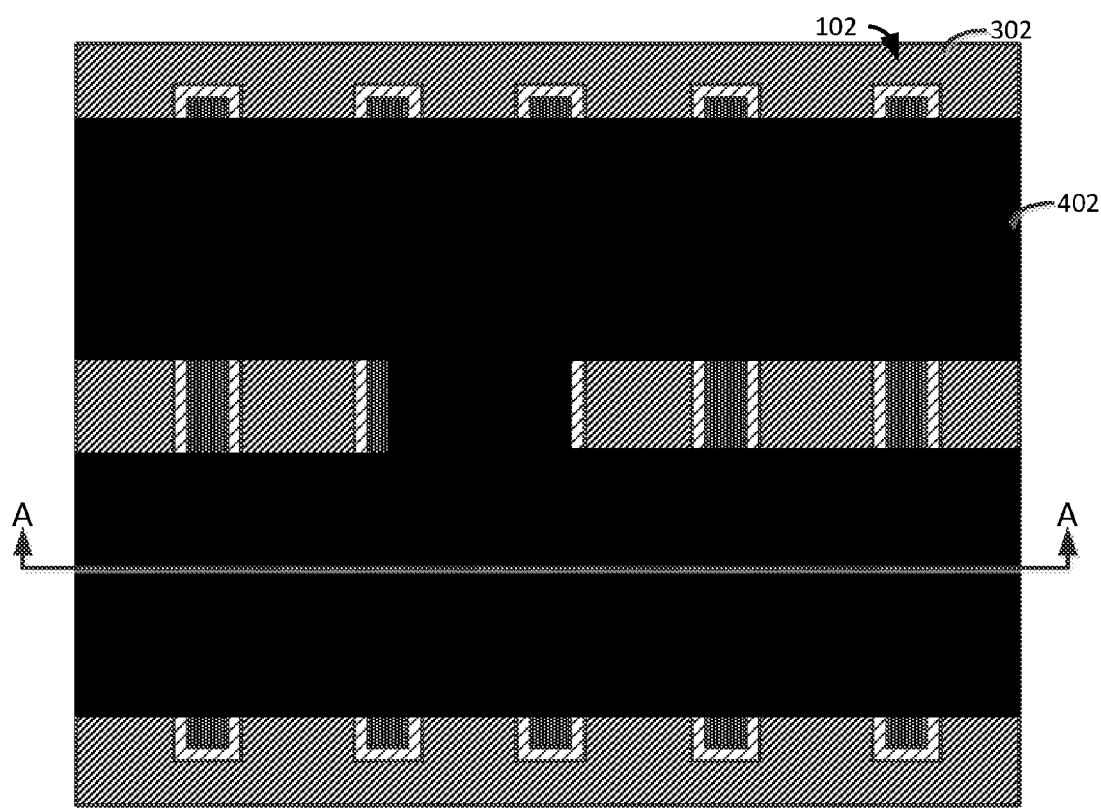
FIG. 4A illustrates a top view of a resist mask.
Figure 4B:
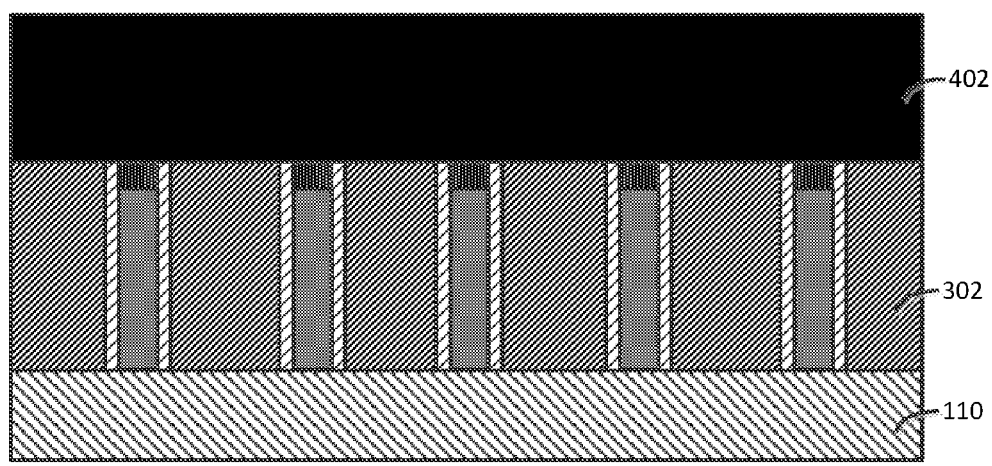
FIG. 4B illustrates a cut away view along the line A-A of FIG. 4A.

FIG. 4A illustrates a top view of a resist mask 402 that is patterned over portions of the conductive material 302 and the gate stacks 102. The mask 402 defines contact regions such that areas obscured by the mask 402 will form contacts as discussed below. FIG. 4B illustrates a cut away view along the line A-A of FIG. 4A. The mask 402 may include, for example, a photolithographic resist. Suitable resists include photoresists, electron-beam resists, ion-beam resists, X-ray resists, and etch resists. The resist may include a polymeric spin on material or a polymeric.

Figure 5:
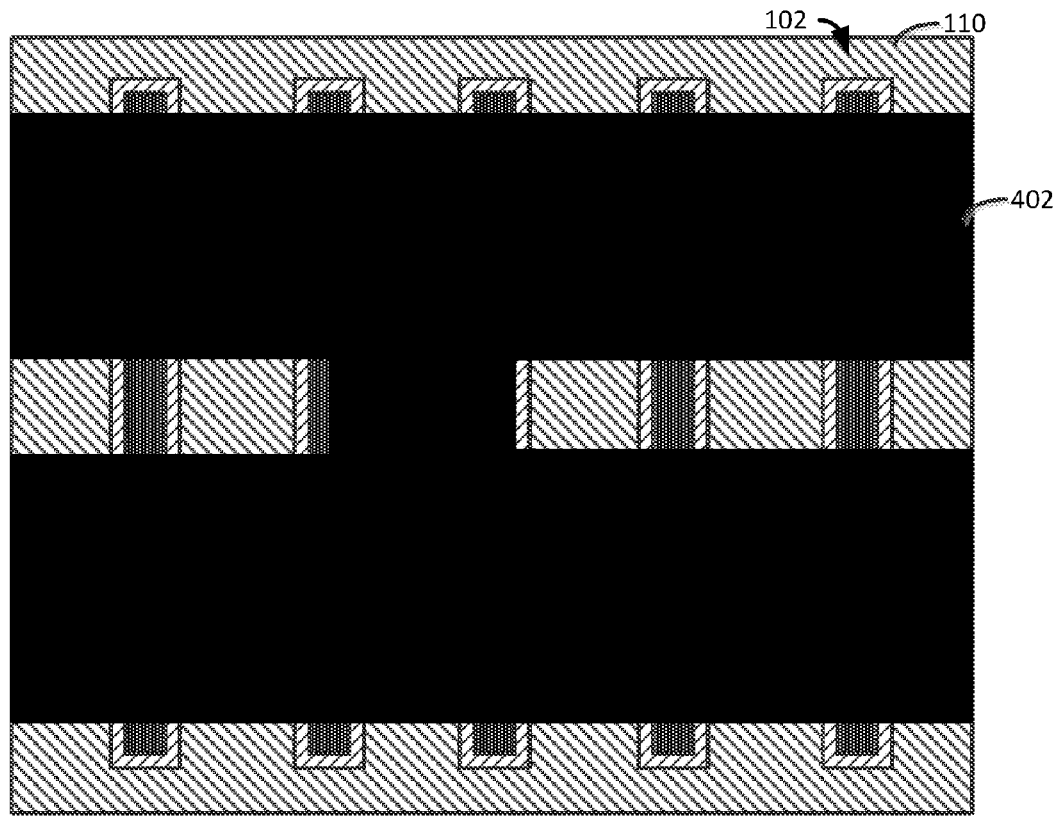
FIG. 5 illustrates a top view following an etching process.

FIG. 5 illustrates a top view following an etching process that is operative to remove exposed portions of the conductive material 302 (of FIG. 4A) and to expose portions of the substrate 110. Using, for example, reactive ion etching (RIE). In one embodiment, the etch process is selective to the gate cap so after the etching process, the gate remains intact. Any other suitable patterning technique can also be used to pattern the conductive material.

Figure 6:
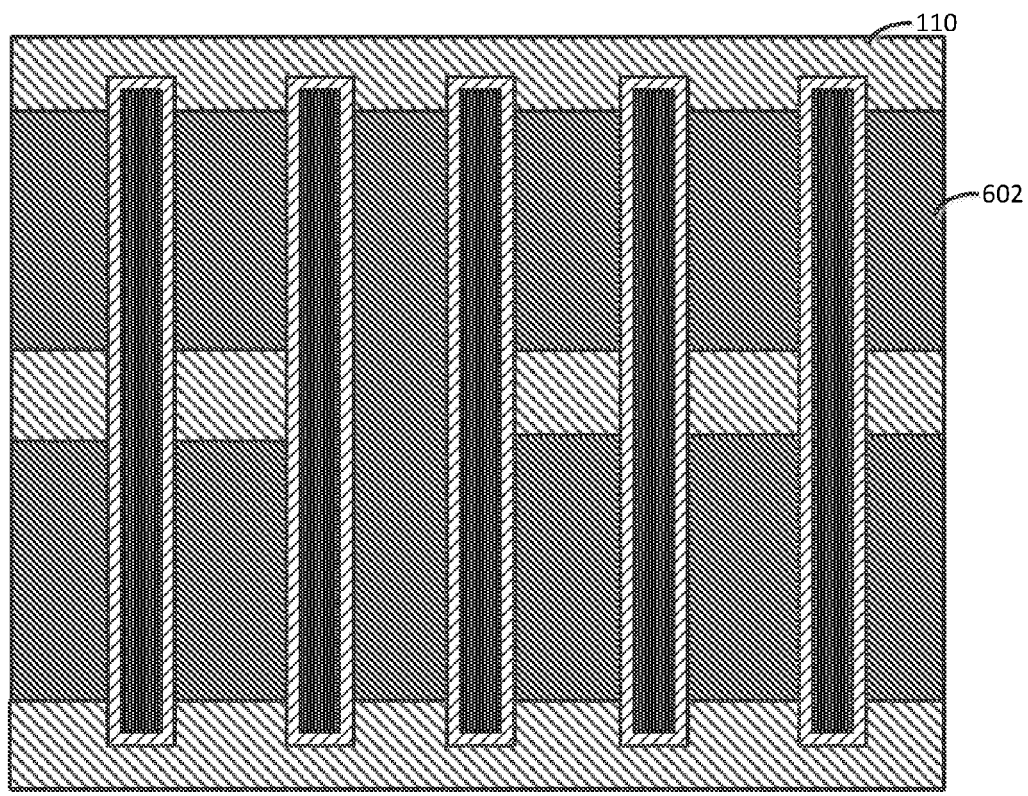
FIG. 6 illustrates the resultant structure following the removal of the mask.

FIG. 6 illustrates the resultant structure following the removal of the mask 402 (of FIG. 5). The etching process described above, patterns the conductive material 302 (of FIG. 5) into conductive contacts 602 that are arranged over the active regions 202 (of FIG. 2A) of the devices. Any other suitable patterning technique can also be used to pattern the conductive material.

Figure 7:
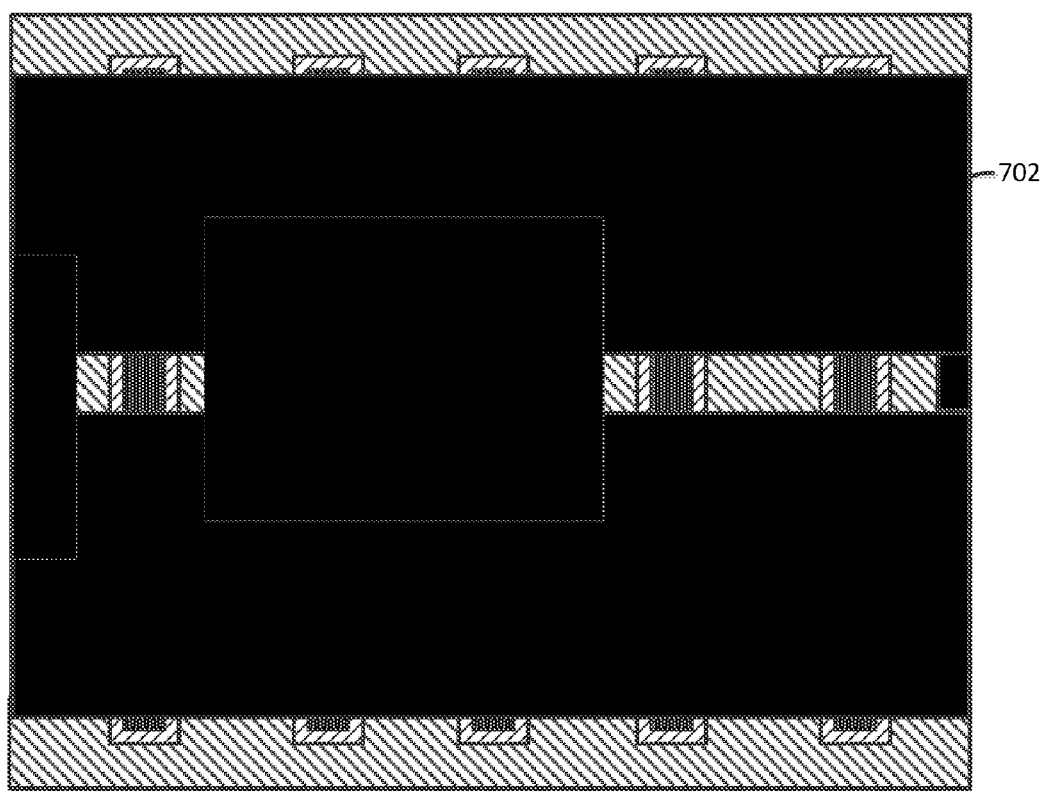
FIG. 7 illustrates a top view of a second mask.

FIG. 7 illustrates a top view of a second mask 702 that is patterned over portions of the gate stacks 102. The second mask 702 may include, for example, a photolithographic resist. Suitable resists include photoresists, electron-beam resists, ion-beam resists, X-ray resists, and etch resists. The resist may include a polymeric spin on material or a polymeric material.

Figure 8A:
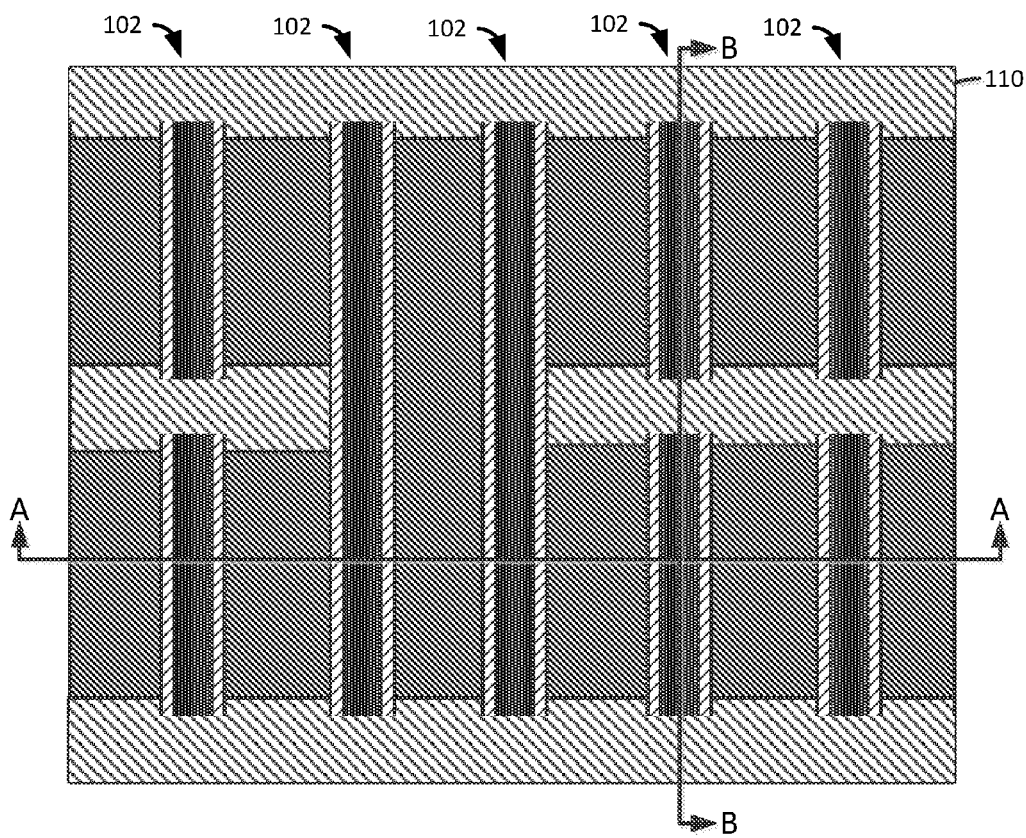
FIG. 8A illustrates a top view of the resultant structure following an etching process.
Figure 8B:
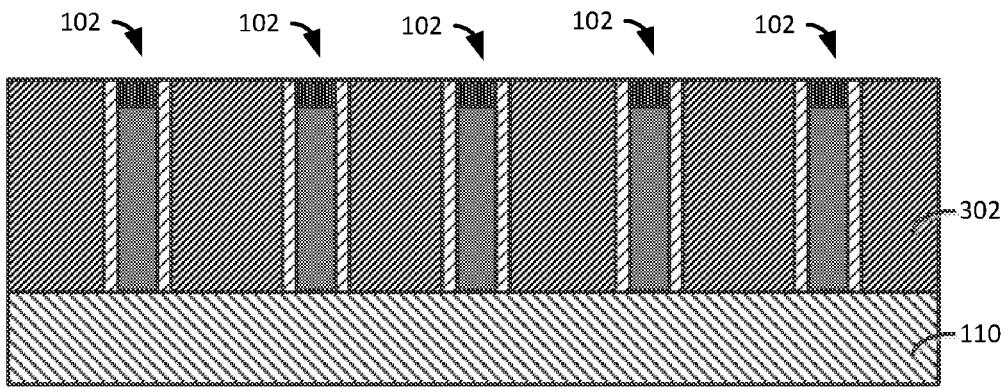
FIG. 8B illustrates a cross sectional view of the resultant structure along the line A-A of FIG. 8A.

FIG. 8A illustrates the resultant structure following an etching process such as, for example, an anisotropic etching process that removes exposed portions of the gate stacks 102 and the spacers 106. The etching process may include, for example, a reactive ion etching process that is selective to the gate stack capping layer 104. The etching process effectively cuts portions of the gate stacks 102 to separate the some of the gate stacks 102 into separate gates. The etching process 102 may also remove end portions of the gate stacks 102. FIG. 8B illustrates a cross sectional view of the resultant structure along the line A-A of FIG. 8A.

Figure 8C:
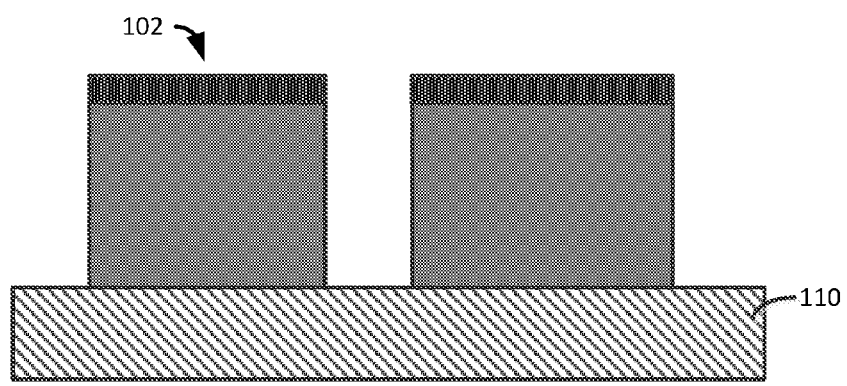
FIG. 8C illustrates a cross sectional view of the resultant structure along the line B-B of FIG. 8A.

FIG. 8C illustrates a cross sectional view of the resultant structure along the line B-B of FIG. 8A.

Figure 9A:
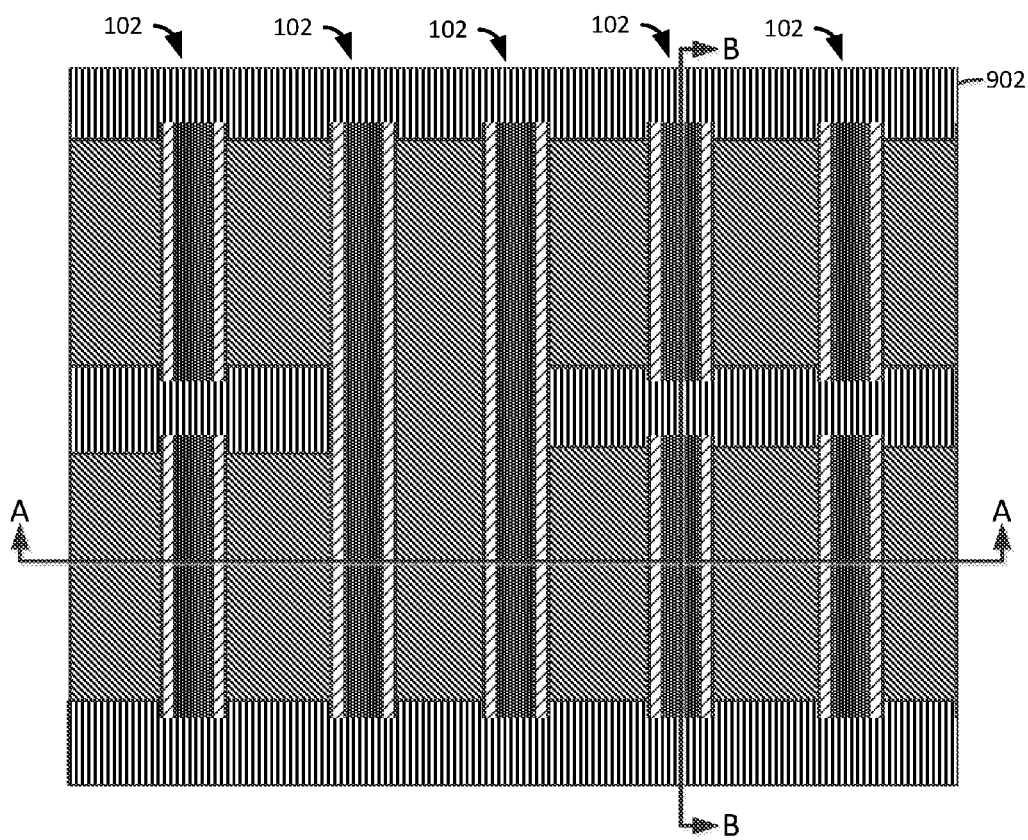
FIG. 9A illustrates a top view following the deposition of an insulator layer following the removal portions of the gate stacks.

FIG. 9A illustrates a top view following the deposition of an insulator layer 902 following the removal portions of the gate stacks 102. The insulator layer 902 may include, for example, a nitride or an oxide material. Following the deposition of the insulator layer, 902, a planarization process such as, for example, chemical mechanical polishing may be performed to expose the gate stacks 102.

Figure 9B:
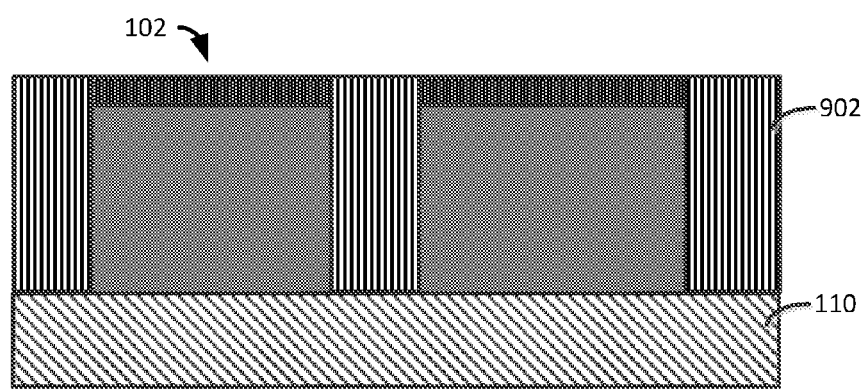
FIG. 9B. illustrates a cross sectional view of the resultant structure along the line B-B of FIG. 9A.

FIG. 9B. illustrates a cross sectional view of the resultant structure along the line B-B of FIG. 9A.

Figure 10A:
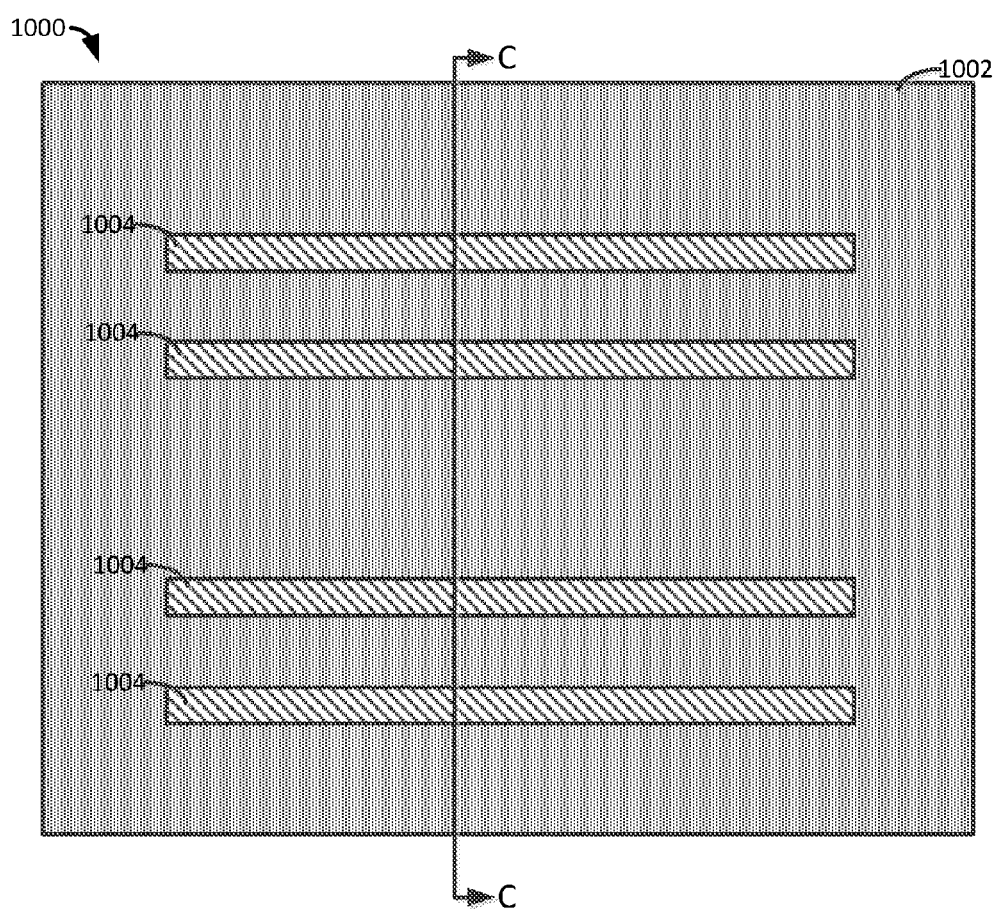
FIG. 10A illustrates a top view of another exemplary method for forming FET devices.
Figure 10B:
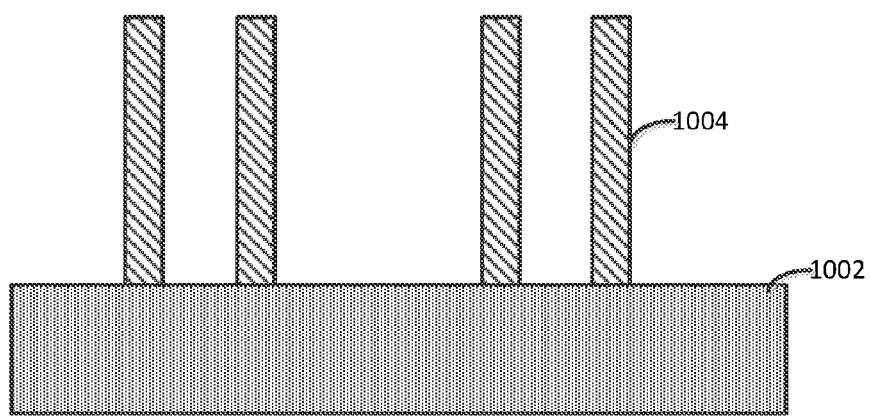
FIG. 10B illustrates a cross sectional view along the line C-C of FIG. 9A.

FIG. 10A illustrates a top view of another exemplary method for forming FET devices. In FIG. 10A a semiconductor on insulator (SOI) substrate 1000 that may include any suitable semiconductor material is patterned to form a plurality of semiconductor fins 1004. An SOI wafer includes a thin layer of a semiconducting material atop an insulating layer 1002 (i.e., an oxide layer) which is in turn disposed on a silicon substrate (not shown). The semiconducting material can include, but is not limited to, Si (silicon), strained Si, SiC (silicon carbide), Ge (geranium), SiGe (silicon germanium), SiGeC (silicon-germanium-carbon), Si alloys, Ge alloys, GaAs (gallium arsenide), InAs (indium arsenide), InP (indium phosphide), or any combination thereof. The fins 1004 are formed by a lithographic patterning and etching process that is operative to remove exposed portions of the semiconductor material to form fins 1004 using, for example, a reactive ion etching process. FIG. 10B illustrates a cross sectional view along the line C-C of FIG. 10A. Though the illustrated embodiment includes an SOI substrate 1000, alternate exemplary embodiments may include other types of substrates including, for example, a bulk semiconductor substrate with fins patterned in the substrate and isolated by an insulator material disposed between the fins.

Figure 11A:
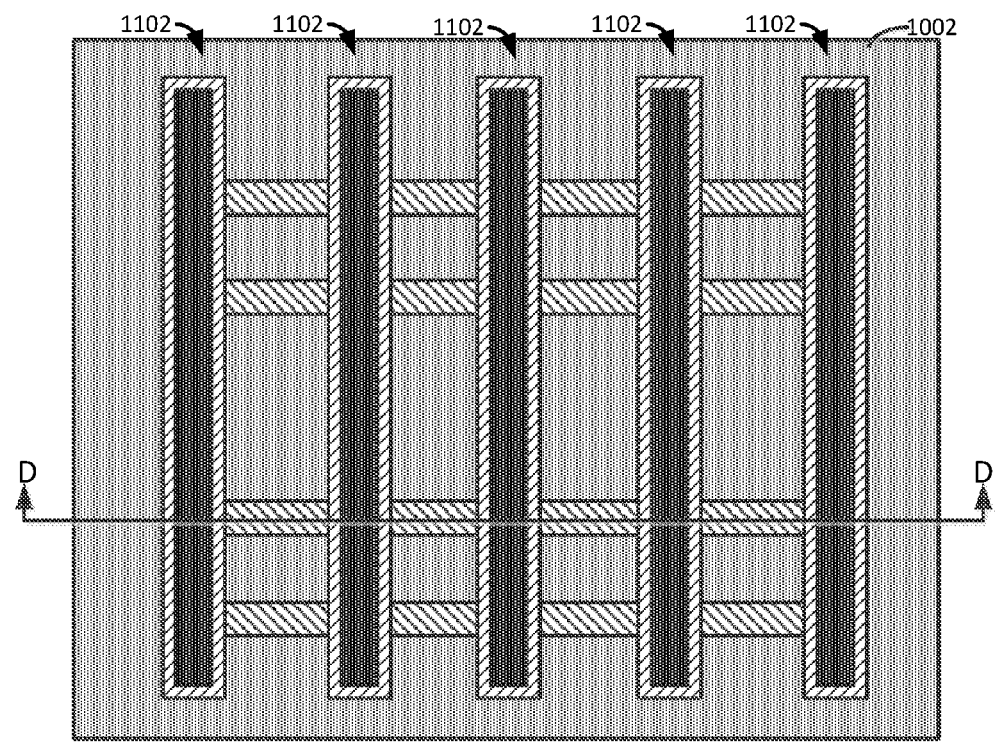
FIG. 11A illustrates a top view of the formation of gate stacks.
Figure 11B:
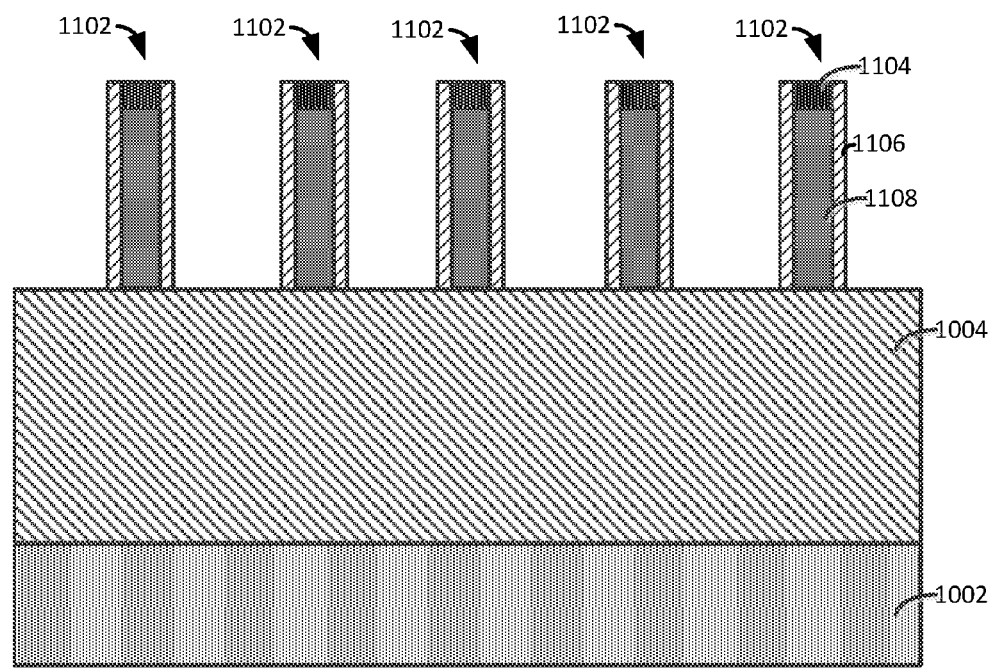
FIG. 11B illustrates a cut away view along the line D-D of FIG. 10A.

FIG. 11A illustrates a top view of the formation of gate stacks 1102 over portions of the fins 1004 and the insulator layer 1002. The gate stacks 1102 in the illustrated embodiment include metal gate materials as described above. In alternate exemplary embodiments the gate stacks 1102 may include dummy gates or sacrificial gates that may be replaced with gate material in subsequent processes. FIG. 11B illustrates a cut away view along the line D-D of FIG. 11A. The gate stacks 1102 includes high-k metal gates formed, for example, patterning one or more layers of high-k dielectric materials, one or more workfunction metals, and one or more metal gate conductor materials 1008. A cap layer 1104 is arranged on the gate stack 1102. The cap layer 1104 may include, for example, an oxide or nitride material. Spacers 1106 are arranged adjacent to the gate stack 1102, and may include, for example, an oxide or nitride material.

Figure 12A:
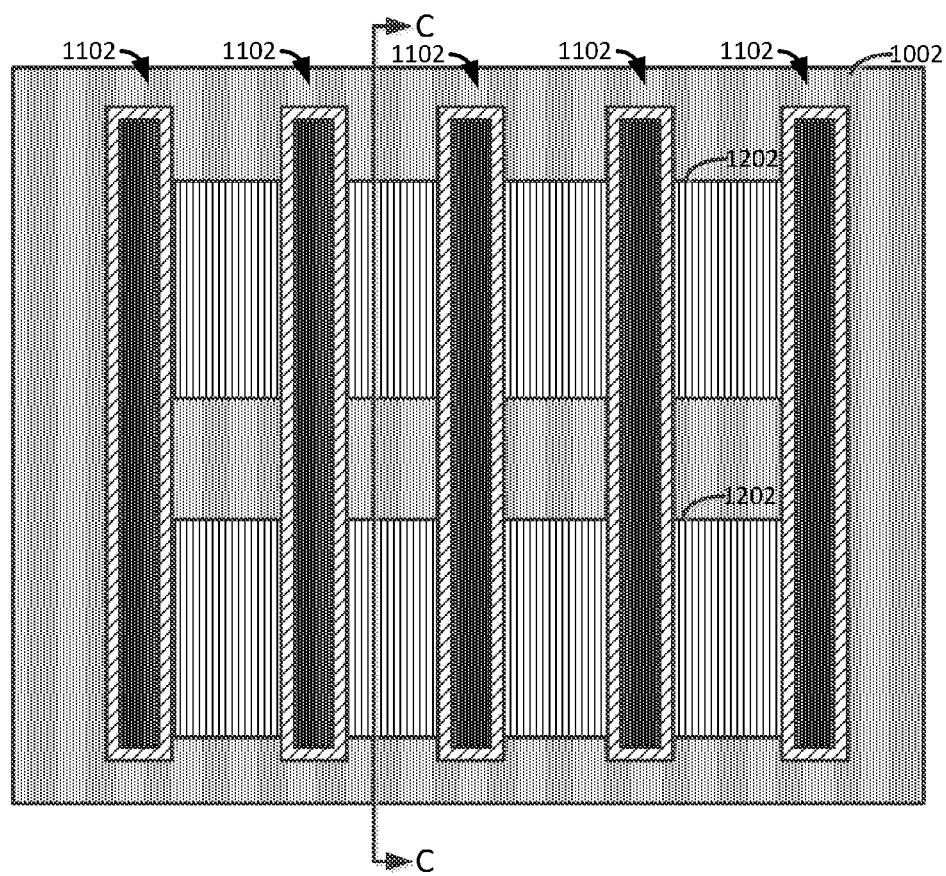
FIG. 12A illustrates a top view of the resultant structure following an epitaxial growth process.
Figure 12B:
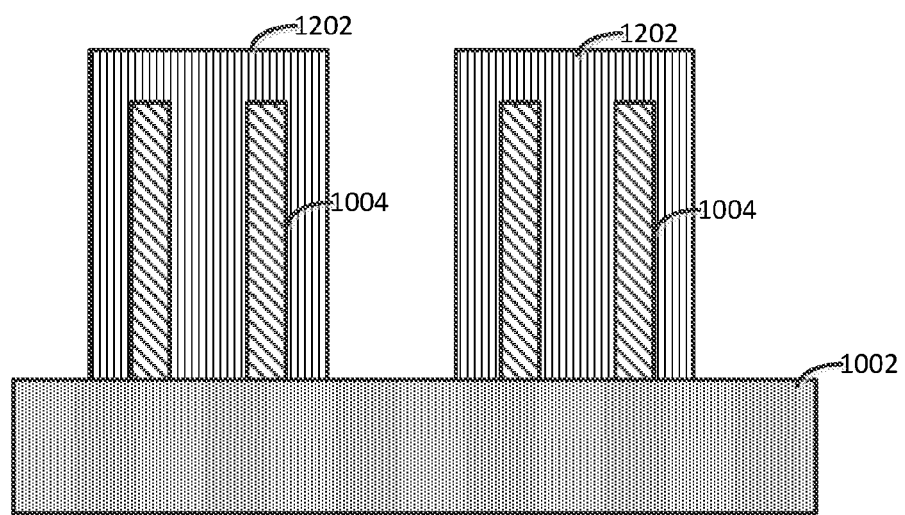
FIG. 12B illustrates a side cut away view of along the line C-C of FIG. 11A of the fins and the epitaxially grown active regions.

FIG. 12A illustrates a top view of the resultant structure following an epitaxial growth process that epitaxially grows semiconductor material on the exposed portions of the fins 1004 (of FIG. 11A). An epitaxial growth process is performed to grow a crystalline layer onto a crystalline materials. The underlying substrate acts as a seed crystal. Epitaxial layers may be grown from gaseous or liquid precursors. Epitaxial silicon may be grown using vapor-phase epitaxy (VPE), molecular-beam epitaxy (MBE), liquid-phase epitaxy (LPE), or other suitable process. The epitaxial silicon, silicon germanium, and/or carbon doped silicon (Si:C) silicon can be doped during deposition by adding a dopant or impurity. The silicon may be doped with an n-type dopant (e.g., phosphorus or arsenic) or a p-type dopant (e.g., boron or gallium), depending on the type of transistor. In the illustrated embodiment, there are two active regions 1202. The active regions 1202 may be doped in-situ during the epitaxial growth process, or following the epitaxial growth by, for example, an ion implantation and annealing process. The each of the active regions 1202 may be doped with different types of dopants to form different types of devices. If different dopants are used in the active regions 1202, each of the active regions 1202 may be formed separately using by, for example, using block masking or other methods to form dissimilar active regions 1202 if desired. FIG. 12B illustrates a side cut away view of along the line C-C of FIG. 12A of the fins 1004 and the epitaxially grown active regions 1202.

After the active regions 1202 are formed, a silicide may be formed on the active regions 1202 if desired. A silicide may be formed by, for example, depositing a conductive material on the active regions 1202 and performing an annealing process to form a silicide layer (not shown) on the exposed active regions 1202.

Figure 13A:
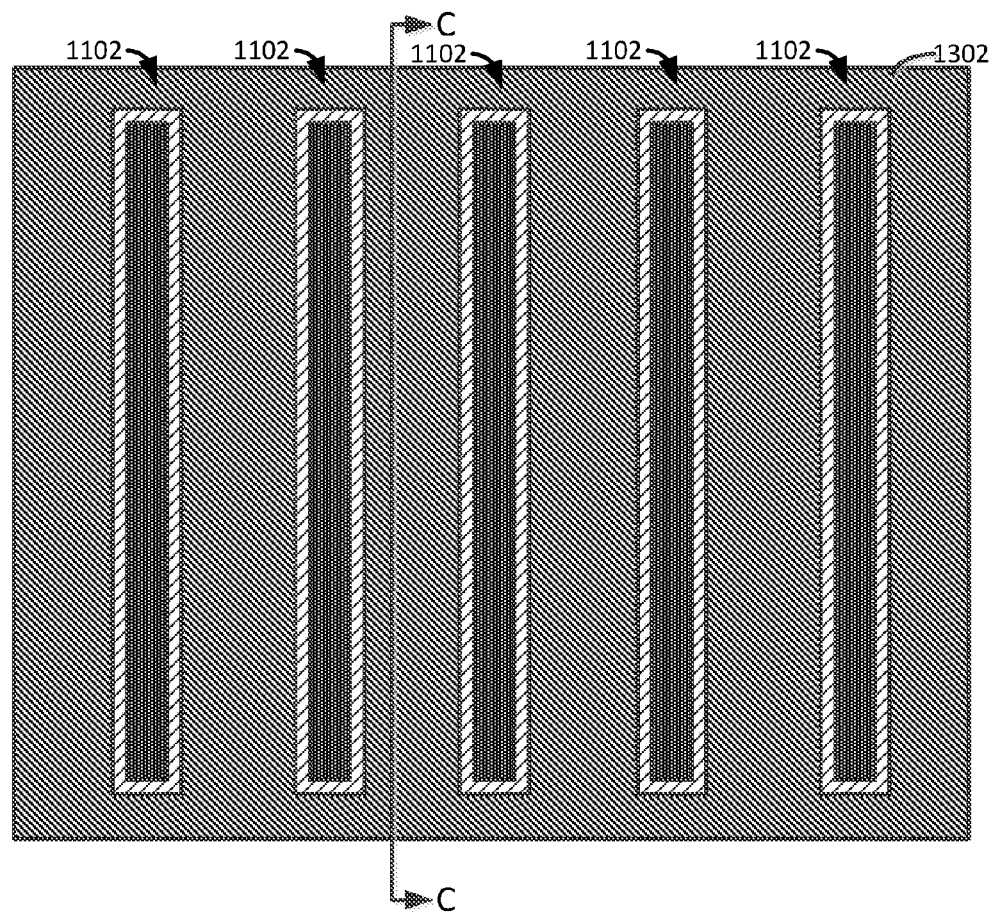
FIG. 13A illustrates a top view of the resultant structure following the deposition of a layer of conductive material.
Figure 13B:
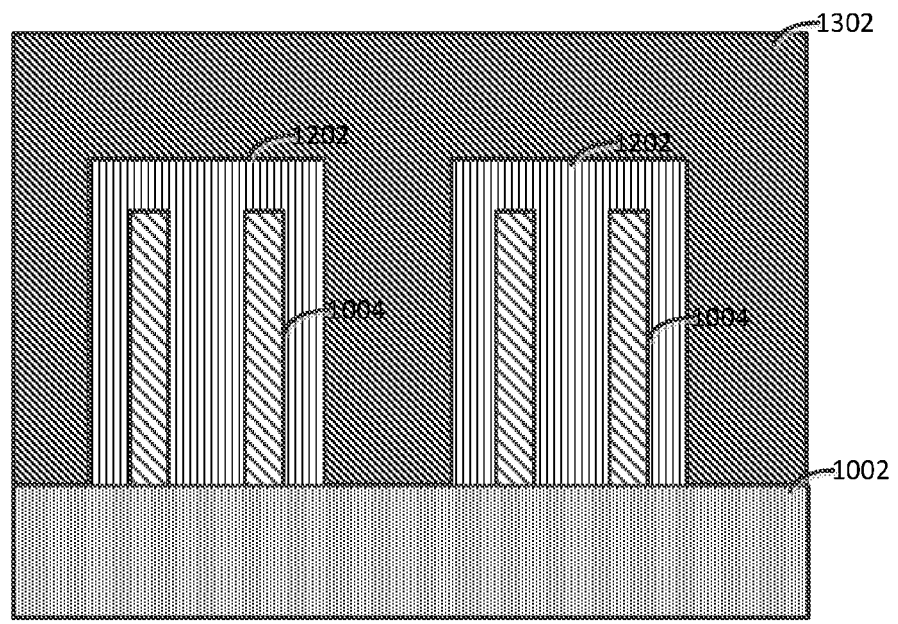
FIG. 13B illustrates a cut away view along the line C-C of FIG. 12A.

FIG. 13A illustrates a top view of the resultant structure following the deposition of a layer of conductive material 1302. The layer of conductive material 1302 is deposited over the exposed portions of the insulator layer 1002, the active regions 1202 and the gate stacks 1102. The layer of conductive material 1302 may be deposited by, for example, a spin on deposition process. Following the deposition of the layer of conductive material 1302, a planarization process such as, for example, chemical mechanical polishing (CMP) is performed to remove overburden portions of the conductive material 1302 and expose the gate stacks 1102. FIG. 13B illustrates a cut away view along the line C-C of FIG. 13A.

Figure 14:
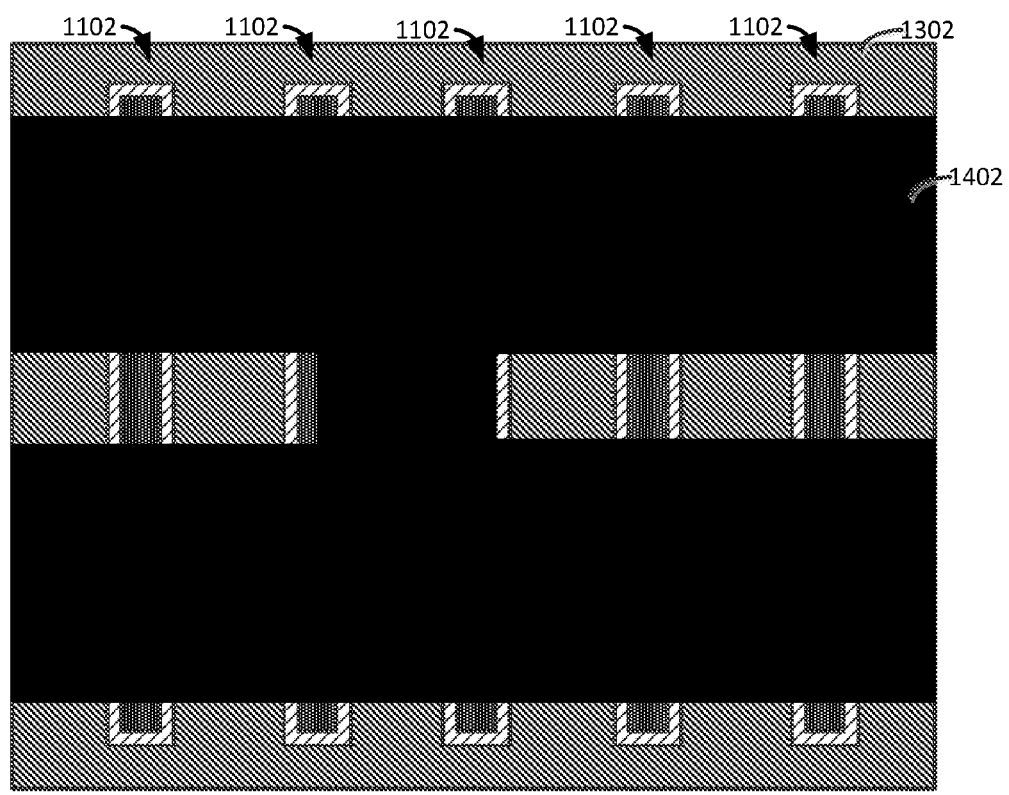
FIG. 14 illustrates a top view of the resultant structure following the patterning and deposition of a mask.

FIG. 14 illustrates a top view of the resultant structure following the patterning and deposition of a mask 1402 that defines conductive contact regions.

Figure 15:
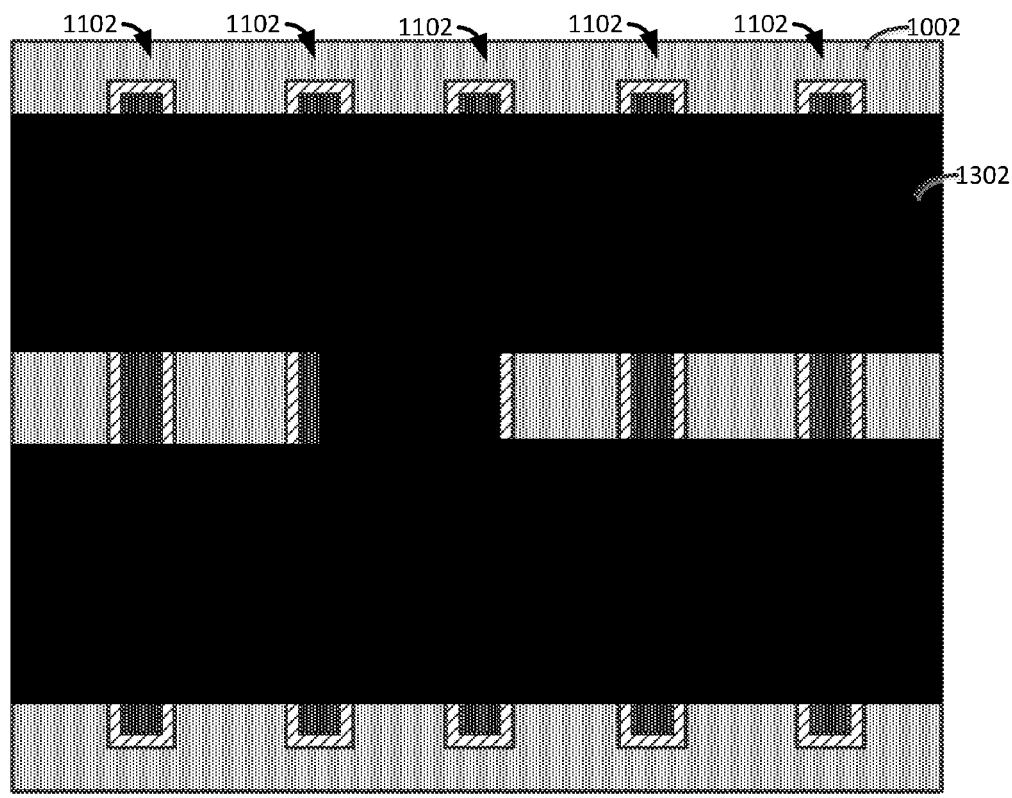
FIG. 15 illustrates a top view following an etching process.

FIG. 15 illustrates a top view following an etching process such as, for example, an RIE process that removes portions of the conductive material 1302 and exposes portions of the insulator layer 1002.

Figure 16:
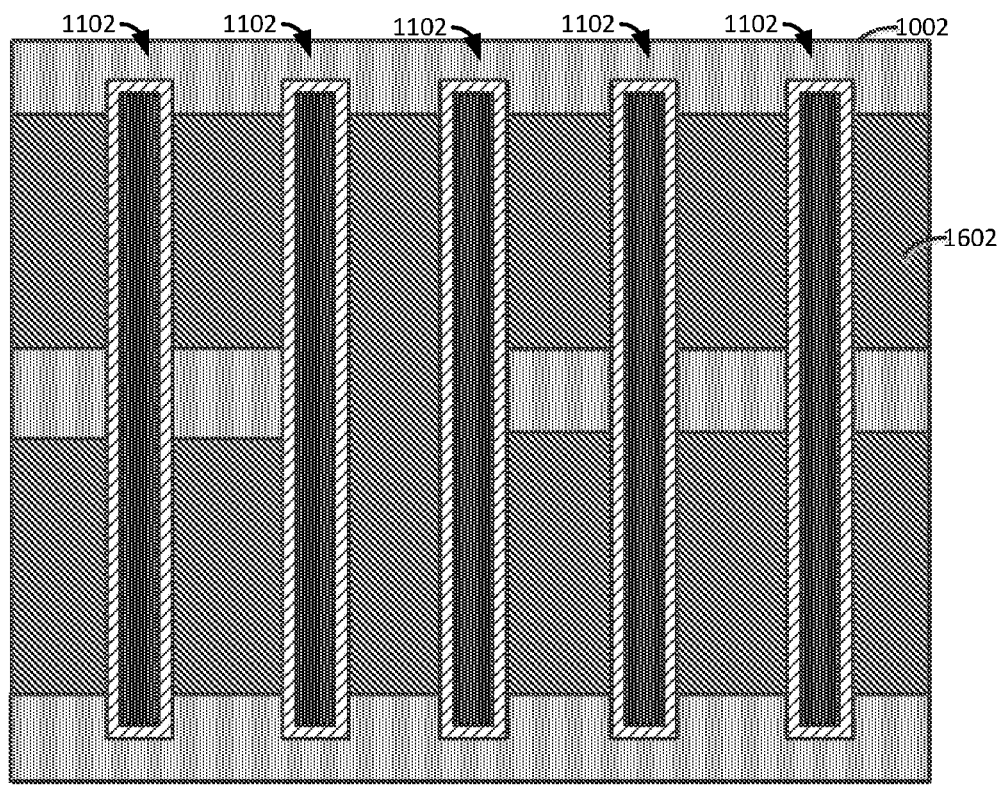
FIG. 16 illustrates a top view following the removal of the mask.

FIG. 16 illustrates a top view following the removal of the mask 1402 (of FIG. 14). The conductive contacts 1602 are arranged over the active regions 1202 (of FIG. 12A).

Figure 17:
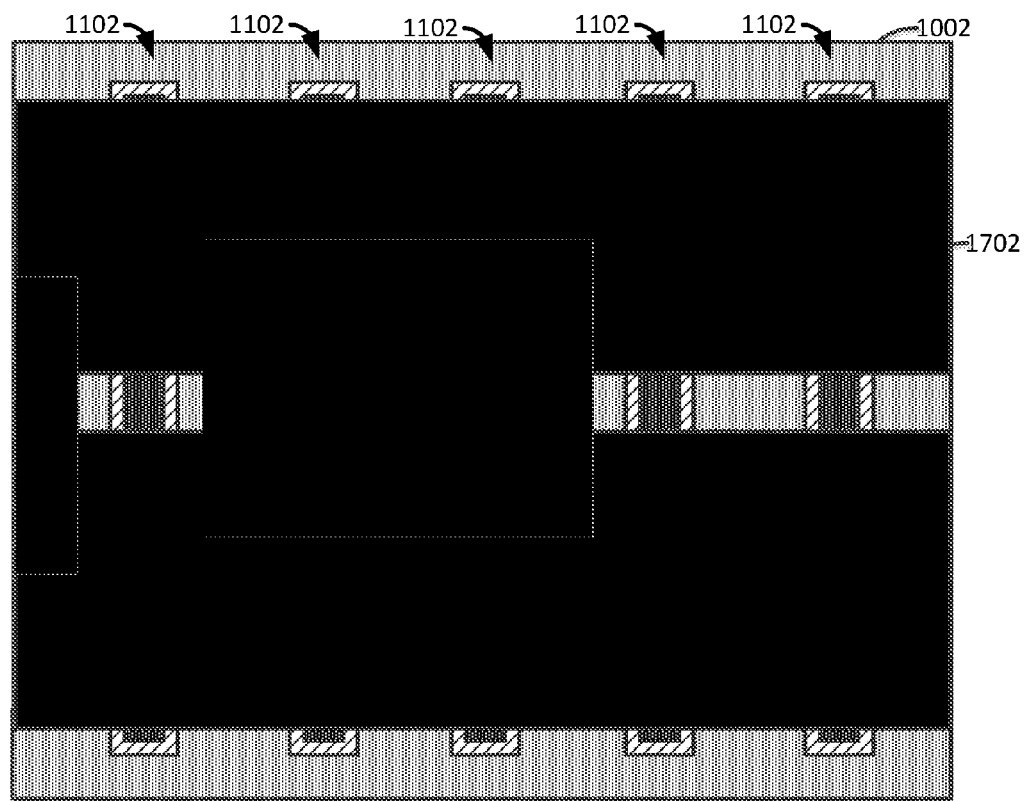
FIG. 17 illustrates a top view of following the patterning and deposition of a second mask.

FIG. 17 illustrates a top view of following the patterning and deposition of a second mask 1702. The mask 1702 is formed in a similar manner as the mask 702 of FIG. 7 described above.

Figure 18A:
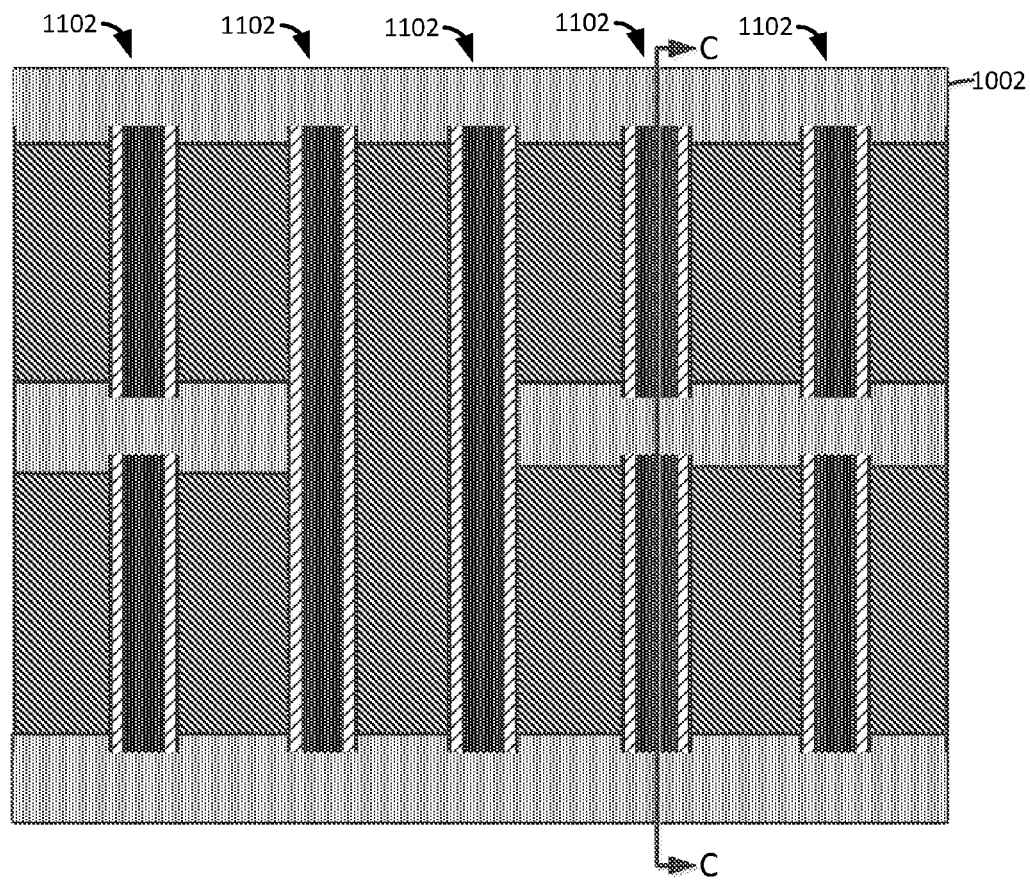
FIG. 18A illustrates a top view of the resultant structure following an etching process.
Figure 18B:
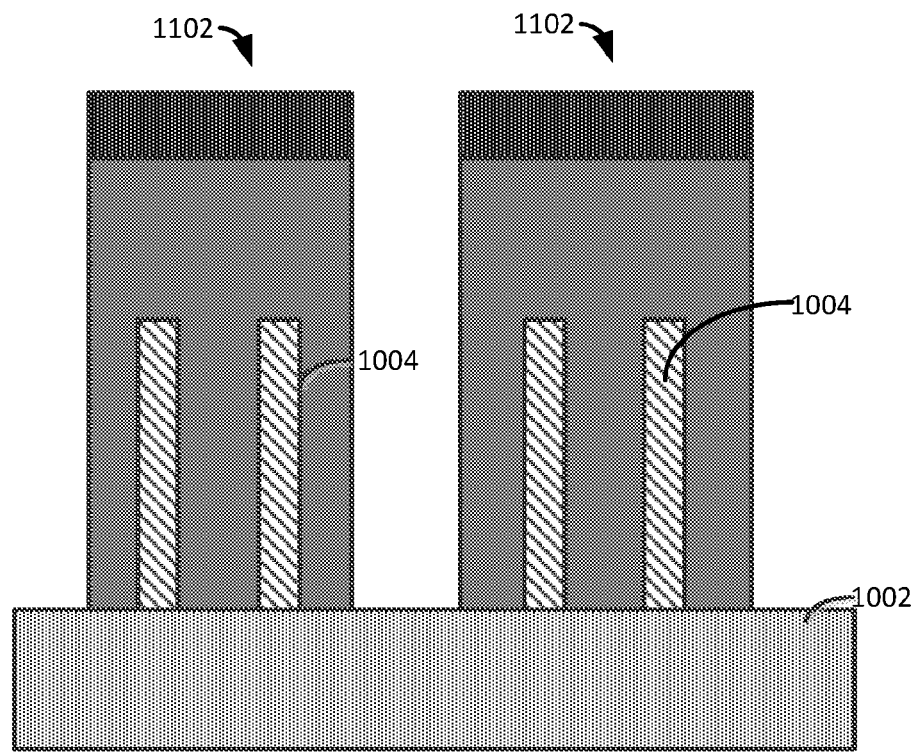
FIG. 18B illustrates a cross sectional view of the resultant structure along the line C-C of FIG. 18A.

FIG. 18A illustrates a top view of the resultant structure following an etching process such as, for example, an anisotropic etching process that removes exposed portions of the gate stacks 1102 and the spacers 1106. The etching process may include, for example, a reactive ion etching process that is selective to the gate stack capping layer 1104. The etching process effectively cuts portions of the gate stacks 1102 to separate the some of the gate stacks 1102 into separate gates. The etching process may also remove end portions of the gate stacks 1102. FIG. 18B illustrates a cross sectional view of the resultant structure along the line C-C of FIG. 18A.

Figure 19A:
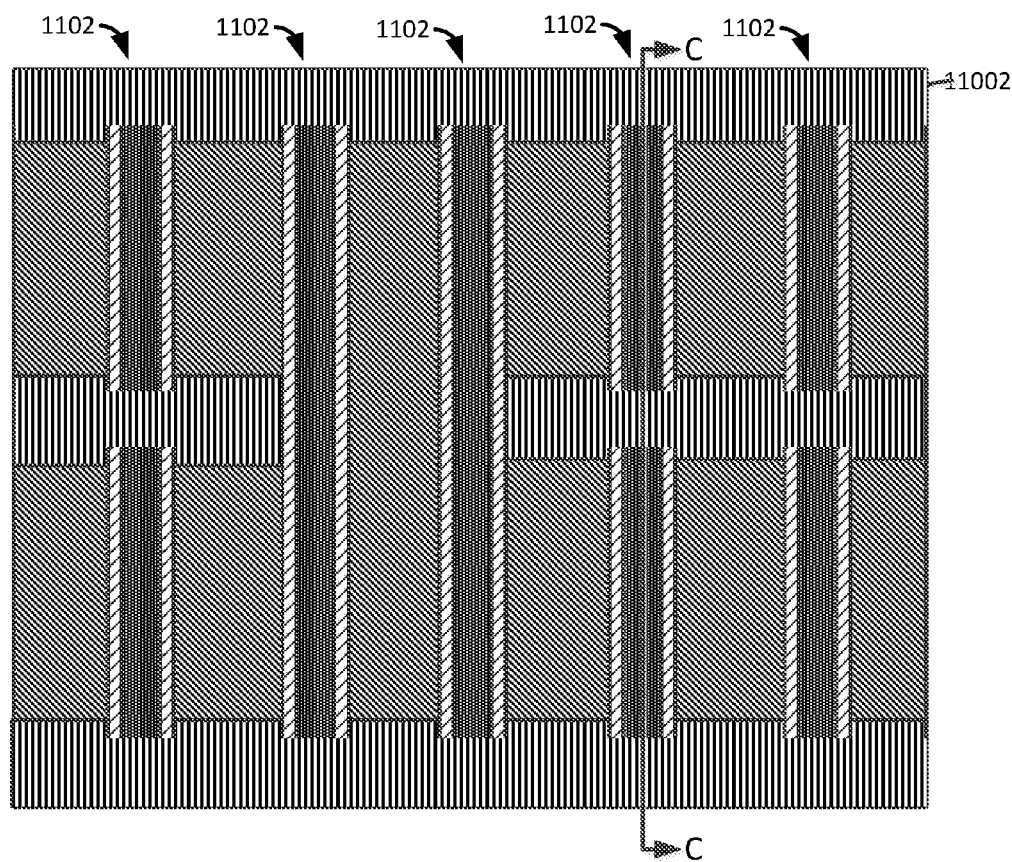
FIG. 19A illustrates a top view following the deposition of an insulator layer following the removal portions of the gate stacks.

FIG. 19A illustrates a top view following the deposition of an insulator layer 1002 following the removal portions of the gate stacks 1102. The insulator layer 1002 may include, for example, a nitride or an oxide material. Following the deposition of the insulator layer, 1002, a planarization process such as, for example, chemical mechanical polishing may be performed to expose the gate stacks 1102.

Figure 19B:
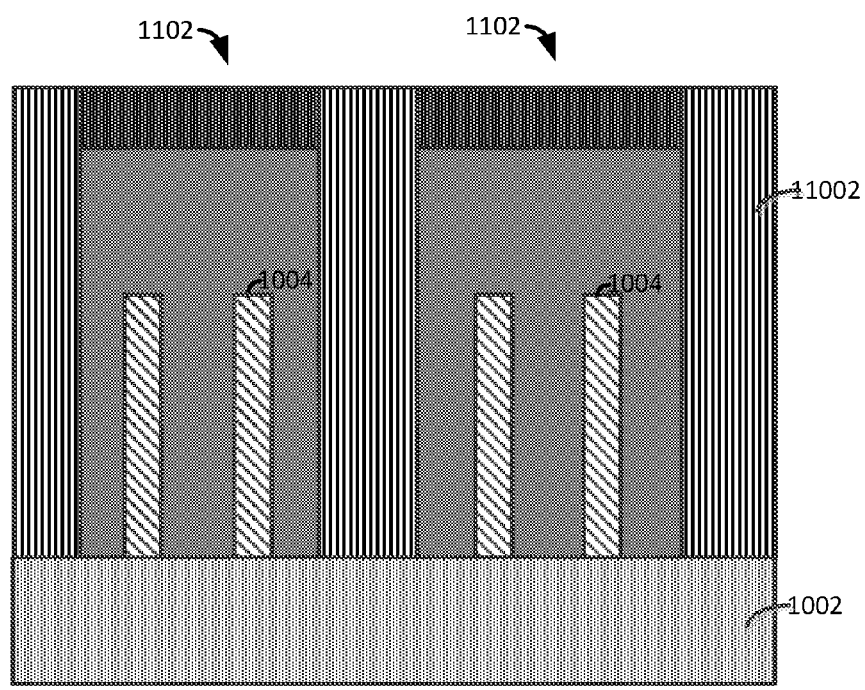
FIG. 19B. illustrates a cross sectional view of the resultant structure along the line B-B of FIG. 19A.

FIG. 19B. illustrates a cross sectional view of the resultant structure along the line B-B of FIG. 19A.

The methods and resultant devices described herein provide for forming conductive contacts and cutting gate stacks for devices with tight ground rules for arrangements of FET devices on a substrate. The methods reduce the chances of forming undesirable electrical shorts between ends of the gates as well as electrical shorts between contacts. The methods may be used to form planar, FinFET, multi-dimensional, or other types of semiconductor device.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for fabricating a semiconductor device, the method comprising:
   forming active regions on a semiconductor substrate;
   forming a gate stack over the active regions and regions adjacent to the active regions;
   depositing a layer of conductive material over the active regions and the substrate;
   patterning a first mask over the conductive material;
   etching to remove exposed portions of the conductive material and form conductive contacts;
   patterning a second mask over portions of the gate stacks and conductive contacts; and
   etching to remove exposed portions of the gate stack.

2. The method of claim 1, further comprising forming spacers adjacent to the gate stack.

3. The method of claim 1, further comprising depositing an insulator layer on the substrate adjacent to the gate stack prior to forming the gate stack.

4. The method of claim 1, wherein the conductive material includes a metallic material.

5. The method of claim 1, wherein the etching to remove exposed portions of the conductive material includes an anisotropic etching process.

6. The method of claim 1, wherein the etching to remove exposed portions of the gate stack includes an anisotropic etching process.

7. The method of claim 2, wherein the etching to remove exposed portions of the gate stack includes etching to remove exposed portions of the spacers.

8. The method of claim 3, further comprising removing the insulator layer prior to depositing the layer of conductive material over the active regions and the substrate.

9. A method for forming a semiconductor device, the method comprising:
   etching a semiconductor substrate to pattern a fin on the substrate;
   forming a gate stack over the fin;
   forming a spacer adjacent to the gate stack;
   forming an active region on the fin;
   depositing a layer of conductive material on the substrate, the fin, and the active region;
   patterning a first mask over the conductive material;
   etching to remove exposed portions of the conductive material and form conductive contacts;
   patterning a second mask over portions of the gate stacks and conductive contacts; and
   etching to remove exposed portions of the gate stack.

10. The method of claim 9, further comprising forming spacers adjacent to the gate stack.

11. The method of claim 9, further comprising depositing an insulator layer on the substrate adjacent to the gate stack prior to forming the gate stack.

12. The method of claim 9, wherein the conductive material includes a metallic material.

13. The method of claim 9, wherein the etching to remove exposed portions of the conductive material includes an anisotropic etching process.

14. The method of claim 9, wherein the etching to remove exposed portions of the gate stack includes an anisotropic etching process.

15. The method of claim 9, wherein the forming an active region on the fin includes epitaxially growing a semiconductor material on the fin.

16. The method of claim 9, wherein the gate stack includes a metallic gate material.

17. The method of claim 10, wherein the etching to remove exposed portions of the gate stack includes etching to remove exposed portions of the spacers.

18. The method of claim 11, further comprising removing the insulator layer prior to depositing the layer of conductive material over the active regions and the substrate.

19. The method of claim 15, wherein the method further comprises implanting dopants in the active region.

* * * * *